(12) United States Patent
Yamada

(10) Patent No.: US 7,126,269 B2
(45) Date of Patent: Oct. 24, 2006

(54) ORGANIC ELECTROLUMINESCENCE DEVICE

(75) Inventor: Jiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 143 days.

(21) Appl. No.: 10/433,599

(22) PCT Filed: Sep. 18, 2002

(86) PCT No.: PCT/JP02/09581

§ 371 (c)(1),
(2), (4) Date: May 22, 2003

(87) PCT Pub. No.: WO03/030592

PCT Pub. Date: Apr. 10, 2003

(65) Prior Publication Data

US 2005/0099113 A1    May 12, 2005

(30) Foreign Application Priority Data

Sep. 28, 2001    (JP)    ............................. 2001-299648

(51) Int. Cl.
*H01J 1/62*    (2006.01)
(52) U.S. Cl. ...................................... 313/504; 313/506
(58) Field of Classification Search ................ 313/503, 313/504, 506, 501, 509; 428/690, 917
See application file for complete search history.

(56) References Cited

U.S. PATENT DOCUMENTS 4,885,211 A    12/1989    Tang et al.

5,780,174 A *    7/1998    Tokito et al.

(Continued)

FOREIGN PATENT DOCUMENTS

JP    09-092466    4/1997

(Continued)

OTHER PUBLICATIONS

Takada, Noriyuki et al., "Control of emission characteristics in organic thin-film electroluminescent diodes using an optical-microcavity structure" Applied Physics Letters, Oct. 11, 1993, vol. 63, No. 15, pp. 2032-2034, Abstract fig 1 and description thereof.

*Primary Examiner*—Nimesh Patel
*Assistant Examiner*—Anthony Canning
(74) *Attorney, Agent, or Firm*—Robert J. Depke; Rockey, Depke, Lyons & Kitzinger, LLC

(57) ABSTRACT

A self-light-emitting type organic electroluminescence device which makes it possible to restrain to the utmost the absorption of light in an electrode layer, to efficiently take out the light and thereby to obtain sufficient luminance efficiency and the like, in the case of emitting the light through the electrode layer. In an organic electroluminescence device comprising a light-emitting layer (3) comprised of an organic material based the light-emitting layer (3) being sandwiched between a first electrode (2) and a second electrode (4), and light emitted from the light-emitting layer (3) being taken out to at least one of the side of the first electrode (2) and the side of the second electrode (4), the light absorbance of the electrode or electrodes on the side of taking out the light, of the first electrode (2) and the second electrode (4), is not more than 10%.

1 Claim, 1 Drawing Sheet

U.S. PATENT DOCUMENTS

| | | | |
|---|---|---|---|
| 5,847,506 A * | 12/1998 | Nakayama et al. | 313/504 |
| 5,891,554 A * | 4/1999 | Hosokawa et al. | 428/212 |
| 6,249,082 B1 * | 6/2001 | Fukuyoshi et al. | 313/479 |
| 2002/0070663 A1 * | 6/2002 | Ogura et al. | 313/506 |
| 2002/0167269 A1 * | 11/2002 | Sugimoto et al. | 313/504 |
| 2003/0062828 A1 * | 4/2003 | Sugimoto et al. | 313/506 |
| 2004/0021414 A1 * | 2/2004 | Hanawa et al. | 313/506 |

FOREIGN PATENT DOCUMENTS

| | | |
|---|---|---|
| JP | 2001-243840 | 9/2001 |

* cited by examiner

ORGANIC ELECTROLUMINESCENCE DEVICE

This application claims priority to International Application No. PCT/JP02/09581, filed Sep. 18, 2002, and Japanese Patent Application Number JP2001-299648, filed Sep. 28, 2001, each of which are incorporated herein by reference.

TECHNICAL FIELD

The present invention relates to an organic electroluminescence device (hereinafter referred to as "organic EL device"), which is a self-light-emitting type display device.

BACKGROUND ART

In recent years, the organic EL device is paid attention to as a display device for constituting a flat-panel display. The organic EL device generally has a structure in which an organic material is sandwiched between electrodes (an anode and a cathode) from the ups and downs. With a driving current applied to both electrodes, positive holes and electrons are injected respectively from both the electrodes into an organic layer composed of the organic material, and the positive holes and the electrons are recombined with each other in the organic layer, whereby light emission is induced.

As an example of such an organic EL device, there is known a top emission type using the so-called TAC (Top emission Adaptive Current drive) technology, as for example shown in FIG. 1. In the organic EL device shown, a first electrode 2 formed of a light-reflective material and functioning as an anode (positive electrode), an organic layer 3 which is comprised, for example, of a buffer layer 3a, a hole (positive hole) transport layer 3b and an organic light-emitting layer 3c functioning also as an electron transport layer, a second electrode 4 which is comprised of a semi-transparent reflective layer 4a and a transparent electrode layer 4b and functioning as a cathode (negative electrode), and a passivation film 5 formed of a transparent dielectric, are sequentially laminated on a substrate 1, and light from the organic light-emitting layer 3c is taken out to the side of the second electrode 4. Furthermore, the organic EL device has a resonator structure in which the light emitted from the organic light-emitting layer 3c is resonated between the first electrode 2 and the semi-transparent reflective layer 4a of the second electrode 4, and only the light at the resonance wavelength is augmented by the resonator structure so that light with a high peak and a narrow spectrum can be taken out, whereby the color reproduction range of the emitted light can be enlarged.

Besides, as another example of organic EL device, there is known a both-side transparent type one as for example shown in FIG. 2 (Gu et al, Appl. Phys. Lett. 68(19), 1996). In the organic EL device shown, a first electrode 12 having a light transmissive property and functioning as an anode, an organic layer 13 which comprises a hole transport layer 13a and an organic light-emitting layer 13b, and a second electrode 14 which is comprised of a semi-transparent reflective layer 14a and a transparent electrode layer 14b and functions as a cathode, are sequentially laminated on a substrate 11 formed of a transparent glass or the like. Light from the organic light-emitting layer 13b can be taken out to both the sides of the first electrode 12 and of the second electrode 14.

In both of these organic EL devices, the second electrode 4, 14 comprise the semi-transparent reflective layer 4a, 14a as an extremely thin film, in order to enhance a light transmissive property and to secure electrical characteristics. The semi-transparent reflective layers 4a and 14a are formed by co-vapor deposition of magnesium (Mg) and silver (Ag) in an atomic ratio in the range of about 30:1 to 5:1. Namely, the semi-transparent reflective layers 4a and 14a are formed of an alloy containing magnesium as a main constituent.

In the above-mentioned organic EL devices according to the prior art, however, since the semi-transparent reflective layer 4a, 14a is formed of an alloy containing magnesium as a main constituent, the absorption of light in the semi-transparent reflective layer 4a, 14a itself is large, resulting in that the efficiency of taking out the light from the organic light-emitting layer 3c, 13b may be lowered.

For example, when a general magnesium-silver co-vapor deposition film (atomic ratio of about 10:1) is irradiated with light having a wavelength of 550 nm, the reflectance, transmittance and absorbance of light in the co-vapor deposition film are as shown in Table 1 below. Namely, the absorbance is about 16%, even when the thickness of the co-vapor deposition film is varied from 10–15 nm.

TABLE 1

| Film thickness | Reflectance (%) | Transmittance (%) | Absorbance (%) |
|---|---|---|---|
| 10 nm | 51 | 33 | 16 |
| 12 nm | 43 | 41 | 16 |
| 15 nm | 60 | 24 | 16 |

When the light absorbance is high, the influence thereof is increased, particularly in the top emission type organic EL device. For example, in the case where the light reflectance on the side of the first electrode 2 is 100, the light from the organic light-emitting layer 3c is transmitted through the second electrode 4, or is reflected by the semi-transparent reflective layer 4a of the second electrode 4 to the side of the first electrode 2, or is absorbed into the semi-transparent reflective layer 4a. It should be noted here that since the light reflectance on the side of the first electrode 2 is 100%, the light reflected to the side of the first electrode 2 is caused by the resonator structure to be again incident on the second electrode 4. Therefore, all the light other than the light portion absorbed into the semi-transparent reflective layer 4a is finally emitted to the outside, irrespectively of the light transmittance and reflectance at the second electrode 4. This means that the efficiency of taking out the light from the organic light-emitting layer 3c is lowered as much as the light absorbance in the semi-transparent reflective layer 4a is large. Even where the reflectance on the side of the first electrode 2 is less than 100%, the stronger the light interference effect due to the resonator structure gets, the more dependant on the absorbance in the semi-transparent reflective layer 4a intend to be.

On the other hand, in the both-side transparent organic EL device, since it has not the resonator structure, only the light portion transmitted through the second electrode 14 is emitted to the outside as the light on the side of the second electrode 14. It should be noted here that the sum total of the light reflectance, transmittance and absorbance is normally constant (100%). Therefore, the light transmittance is influenced as much as the light absorbance is increased. As a result, the efficiency of taking out the light from the organic light-emitting layer 13b may be lowered.

Accordingly, it is an object of the present invention to provide an organic EL device, which enables to obtain sufficient luminance efficiency and the like by suppressing as much as possible the absorption of light so that the light can be taken out efficiently.

DISCLOSURE OF INVENTION

The present invention has been made to attain the above object. In accordance with one aspect of the present invention, there is provided an organic EL device comprising a light-emitting layer comprised of an organic material, the light-emitting layer being sandwiched between a first electrode and a second electrode, and light from the light-emitting layer being taken out to at least one of the first electrode side and the second electrode side, wherein the light absorbance of the electrode or electrodes on the side of taking out the light from the light-emitting layer, of the first electrode and the second electrode, is not more than 10%.

According to the organic EL device constituted as above, since the light absorbance of the electrode or electrodes on the side of taking out the light is no more than 10%, absorption of the light into the electrode or electrodes can be suppressed to the utmost, and the light emitted from the light-emitting layer can be efficiently taken out to the outside.

In accordance with another aspect of the present invention, there is provided an organic EL device comprising a light-emitting layer comprised of an organic material, the light-emitting layer being sandwiched between a first electrode and a second electrode, and light from the light-emitting layer being taken out to at least one of the first electrode side and the second electrode side, wherein the electrode or electrodes on the side of taking out the light comprise a semi-transparent reflective layer, and the semi-transparent reflective layer is formed of silver or an alloy containing silver as a main constituent.

According to the organic EL device constituted as above, since the semi-transparent reflective layer is formed of silver or an alloy containing silver as a main constituent, the light absorbance of the electrode or electrodes on the side of taking out the light can be suppressed, for example, to a value of not more than 10%. Therefore, absorption of the light into the electrode or electrode on the side of taking out the light can be suppressed to the utmost, and the light emitted from the light-emitting layer can be efficiently taken out to the outside.

BEST MODE FOR CARRYING OUT THE INVENTION

Hereinafter, the organic EL device according to the present invention will be described based on the drawings.

Figure 1:
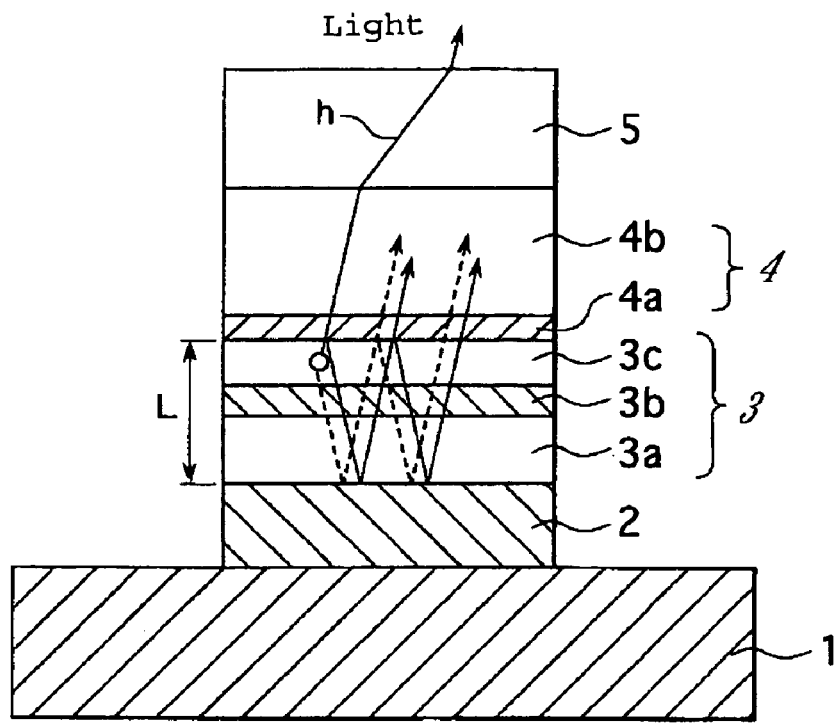
FIG. 1 is a sectional view of an essential part for illustrating a constitution example of a top emission type organic EL device.

Now, the case of applying the present invention to a top emission type organic EL device will be described as an example. The organic EL device to be described here has roughly the same film constitution as that of the conventional case, which has been described above. Namely, as shown in FIG. 1, the organic EL device has a constitution in which a first electrode 2, an organic layer 3, a second electrode 4 and a passivation film 5 are sequentially laminated, in this order from the lower layer, on a substrate 1.

The substrate 1 is comprised of a transparent glass substrate or a semiconductor substrate.

The first electrode 2 is used as an anode functioning also as a reflective layer, and is comprised of a light reflective material such as platinum (Pt), gold (Au), chromium (Cr), tungsten (W) and the like. The film thickness of the first electrode 2 is preferably set in the range of 100 to 300 nm.

The organic layer 3 comprises, for example, a buffer layer 3a, a hole transport layer 3b, and an organic light-emitting layer 3c functioning also as an electron transport layer which are sequentially laminated in this order from the lower layer. Of these layers, the buffer layer 3a is a layer for preventing leakage, and is comprised for example of m-MTDATA [4,4',4"-tris(3-methylphenylphenylamino)triphenylamine], 2-TNATA [4,4',4"-tris(2-naphthylphenylamino)triphenylamine] or the like. The hole transport layer 3b is comprised for example of α-NPD [N,N'-di(1-naphthyl)-N,N'-diphenyl-[1,1'-biphenyl]-4,4'-diamine] or the like. The organic light-emitting layer 3c is comprised of light-emitting materials capable of emitting light in red (R), green (G) and blue (B), respectively; as the light-emitting material for emitting light in G, for example, Alq3 (trisquinolinol aluminum complex) is used. As for the film thicknesses of the layers constituting the organic layer 3, the buffer layer 3a is preferably 15 to 300 nm in thickness, the hole transport layer 3b is preferably 15 to 100 nm in thickness, and the organic light-emitting layer 3c is preferably 15 to 100 nm in thickness.

The second electrode 4 is used as a cathode, and comprises a semi-transparent reflective layer 4a and a transparent electrode layer 4b, which are sequentially laminated in this order from the lower layer. Of these layers, the semi-transparent reflective layer 4a is formed of silver or an alloy containing silver as a main constituent, as will be detailed later. The film thickness of the semi-transparent reflective layer 4a is preferably set in the range of 5 to 50 nm. The transparent electrode layer 4b is formed of a material which is generally used for a transparent electrode, for example, indium tin oxide (ITO), indium zinc oxide, or the like. The film thickness of the second electrode 4 is in the range of 30 to 1000 nm.

The passivation film 5 is formed of a transparent dielectric, and preferably has a refractive index approximately equivalent of those of the materials constituting the second electrode 4. Examples of such a material include silicon oxide ($SiO_2$) and silicon nitride (SiN) or the like. The film thickness of the passivation film 5 may be, for example, in the range of 500 to 10000 nm.

In such a laminate film constitution, the organic layer 3 is sandwiched between the first electrode 2 formed of a light reflective material and the semi-transparent reflective layer 4a of the second electrode 2, so that these constitute a resonator structure. Namely, this organic EL device has a resonator structure in which the light emitted from the organic light-emitting layer 3c is resonated between the first electrode 2 and the semi-transparent reflective layer 4a, and the organic layer 3 functions as a resonance portion of the resonator structure.

In the resonator structure, the optical distance L between the first electrode 2 and the semi-transparent reflective layer 4a, i.e., the optical film thickness of the resonance portion composed of the organic layer 3 is so set that $2L/\lambda$ is a positive minimum value and the relationship of $2L/\lambda + \Phi/2\pi = q$ (q is an integer) is satisfied, where $\Phi$ (radian) is the phase shift generated when the light h emitted from the organic light-emitting layer 3c is reflected by the first electrode 2 and the semi-transparent reflective layer 4a, and λ is the peak wavelength of the spectrum, of the light emitted from the organic light-emitting layer 3, which is to be taken out on the side of the second electrode 4.

In the organic EL device constituted as above, when a DC voltage is impressed between the first electrode 2 and the second electrode 4, positive holes are injected from the first electrode 2 into the organic light-emitting layer 3c through the hole transport layer 3b, whereas electrons are injected from the semi-transparent reflective layer 4a of the second electrode 4 into the organic light-emitting layer 3c. The positive and negative carriers thus injected bring fluorescent molecules in the organic light-emitting layer 3c into an excited state, and light emission is achieved during a relaxation process of the excited molecules. The light obtained by the emission is transmitted through the semi-transparent reflective layer 4a, the transparent electrode 4b and the passivation film 5, to be emitted to the side of the second electrode 4 to the outside.

In this case, the first electrode 2, the organic layer 3 and the semi-transparent reflective layer 4a constitute the resonator structure. Therefore, the organic layer 3 being the resonance portion functions as a narrow-band filter, and only the light h in the vicinity of the peak wavelength λ of the spectrum to be taken out is augmented by multiple interference and is taken out on the side of the second electrode 4. Besides, since the film thickness of the organic layer 3 (the optical distance L of the resonance portion) is set at the positive minimum value of the values for the resonator structure to be composed of the first electrode 2, the organic layer 3 and the semi-transparent reflective layer 4a, the spectrum of the light h taken out is maintained at a largest width in the range in which the multiple interference of the light of the wavelength λ occurs. Namely, the peak intensity is enhanced by the multiple interference while the spectrum of the light taken out maintains a certain width. Therefore, even where the angle of visibility is staggered, the shift amount of the wavelength λ is suppressed to be small, and color purity in a wide range of angle of visibility is enhanced.

Next, the semi-transparent reflective layer 4a in the organic EL device constituted as above, i.e., the most characteristic point of the organic EL device described herein will be described in detail.

In the organic EL device described in the present embodiment, the semi-transparent reflective layer 4 is not composed of an alloy containing magnesium, which is the main constituent as in the prior art but is composed of silver or an alloy containing silver as a main constituent. Examples of the alloy containing silver as a main constituent include silver-magnesium alloys. An alloy of silver, palladium (Pd) and copper (Cu) may also be used. Further, an alloy obtained by co-vapor deposition of a silver-palladium-copper alloy and magnesium may also be used. It is natural that these alloys may be formed by the co-vapor deposition under a vacuum environment and may be formed by other technique.

Figure 2:
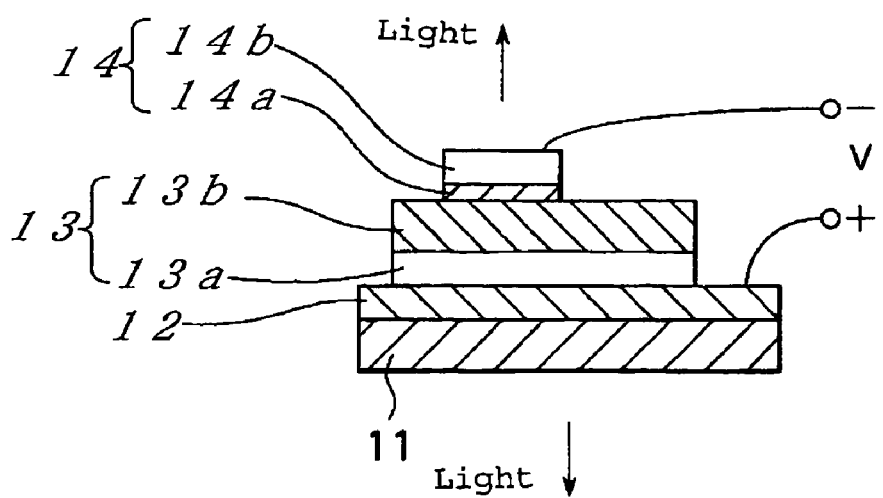
FIG. 2 is a sectional view of an essential part for illustrating a constitution example of a both-side transparent type organic EL device.

Now, the light absorbance of the alloy containing silver as a main constituent will be described. For example, in the case of an alloy obtained by co-vapor deposition of silver as a main constituent and magnesium in an atomic ratio of about 10:1, the light reflectance, transmittance and absorbance upon irradiation with light of a wavelength of 550 nm are as shown in FIG. 2 below.

TABLE 2

| Film thickness | Reflectance (%) | Transmittance (%) | Absorbance (%) |
|---|---|---|---|
| 10 nm | 30 | 65 | 5 |
| 12 nm | 38 | 57 | 5 |
| 15 nm | 48 | 47 | 5 |
| 18 nm | 58 | 37 | 5 |

As is clear from Table 2, it is seen that in the case of the alloy of silver as a main constituent and magnesium, even when the film thickness is varied in the range from 10 to 18 nm, the light absorbance is about 5% over the entire range. Namely, the light absorbance is lowered to about ⅓ times that in the case of the alloy of magnesium as a main constituent and silver according to the prior art. This is considered to arise from the difference in composition.

Therefore, it can be expected that when silver or the alloy containing silver as a main constituent is used as the material for the semi-transparent reflective layer 4a, the light from the organic light-emitting layer 3c can be taken out more efficiently than in the prior art. In order to verify this, the efficiency of taking out the light was measured in the cases of actual constitutions of the organic EL devices. The results are given in Table 3 below.

TABLE 3

| | Luminance-current efficiency (cd/A) | |
|---|---|---|
| | Initial value upon constitution of device | After left to stand at temperature 60° C., humidity 90% for 1000 hrs |
| Mg:Ag 4:1 | 6.5 | 6.5 |
| Ag:Mg 4:1 | 8.0 | 8.0 |
| Ag:Mg 7:1 | 8.5 | 8.0 |
| Ag:Mg 14:1 | 8.5 | 7.5 |
| Ag:Pd:Cu | 8.5 | 6.5 |
| Ag | 8.5 | 4.0 |

In Table 3, as the efficiency of taking out the light, the luminance-current efficiency (cd/A) at the initial stage upon constitution of the device and the luminance-current efficiency (cd/A) after the device is left to stand under the environment of a temperature of 60° C. and a humidity of 90% for 1000 hrs were measured.

In addition, the measurement was conducted for the case of composing the semi-transparent reflective layer 4a by use of silver and the case of composing the semi-transparent reflective layer 4a by use of alloys containing silver as a main constituent, as well as the case of composing the semi-transparent reflective layer 4a by use of an alloy containing magnesium as a main constituent according to the prior art for comparison. As the cases of using silver as a main constituent, the measurement was conducted for the alloys containing silver and magnesium in atomic ratios of 4:1, 7:1, and 14:1, respectively, and for an alloy having a composition in weight ratio of silver:palladium:copper=98:1:1. In each case, the film thickness of the semi-transparent reflective layer 4a was 15 nm. On the other hand, in the case of using magnesium as a main constituent, the atomic ratio of magnesium to silver was 4:1, and the film thickness was set at 12 nm for obtaining the same level of reflectance as that in the cases of using silver as a main constituent. In the case of using only silver, the film thickness was the same as that in the cases of using silver as a main constituent.

As is clear from Table 3, in the cases of using silver or using the alloys containing silver as a main constituent, the luminance-current efficiency at the initial stage upon constitution of the device is enhanced, as compared to the case of using magnesium as a main constituent according to the prior art. This is due to the fact that the light absorbance of silver or each of the alloys containing silver as a main constituent is lower than that of the alloy containing magnesium as a main constituent, as has been described above.

The light absorbance is considered to be about 5%, in the same manner as in the cases shown in Table 2, for example in each of the cases of the alloys containing silver and magnesium in respective atomic ratios of 7:1 and 14:1, the alloy having a composition in weight ratio of silver:palladium:copper=98:1:1, and only silver. In these cases, the luminance-current efficiency is seen to be about 1.3 times as much as that in the case of using magnesium as a main constituent. In the case of the alloy containing silver and magnesium in an atomic ratio of 4:1, the light absorbance is considered to be in the range of 5 to 10%. In this case, the luminance-current efficiency is seen to be about 1.2 times as much as that in the case of using magnesium as a main constituent.

In brief, it can be said that as the silver content is raised, the light absorbance is lowered, and, attendant on this, the luminance-current efficiency at the initial stage upon constitution of the device is increased.

Referring to variation of the luminance-current efficiency with time, however, it is seen that the luminance-current efficiency may be lowered with time in the case where silver or an alloy containing silver as a main constituent is used. Besides, the degree of the lowering increases as the silver content increases. This is considered to be due to a mechanism in which since silver is lower than magnesium in denseness of grain structure, when the silver content increases, deterioration of the device due to penetration of moisture or the like would occur more easily, whereby the luminance-current efficiency is lowered. Such a device deterioration would lead to increases in the number and the size of the portions irrelevant to light emission on the device surface, i.e., the portions called dark spots; therefore, the device deterioration should be obviated to the utmost.

From the foregoing, it is seen that when silver or an alloy containing silver as a main constituent is used, the light absorbance can be suppressed to be not more than 10% and, therefore, the luminance-current efficiency is enhanced as compared with the case of using an alloy containing magnesium as a main constituent, but a higher silver content is not necessarily better and it is desirable to regulate the conditions as follows.

For example, in the case of using an alloy of silver as a main constituent and magnesium, a silver-to-magnesium atomic ratio of not less than 4:1 makes it possible to suppress the light absorbance to or below 10% and, therefore, to obtain an effect of improving the luminance-current efficiency; in consideration of the deterioration with time, however, it is desirable to set the silver-to-magnesium atomic ratio to be not more than 14:1. Namely, the silver-to-magnesium atomic ratio is desirably in the range of from 4:1 to 14:1.

In the case of using an alloy of silver, palladium and copper, in consideration of easiness of forming the alloy or the like in addition to the luminance-current efficiency improving effect besides the deterioration with time as above-mentioned, it may be contemplated to use a silver-palladium-copper alloy containing 0.3 to 1% by weight of palladium and 0.3 to 1% by weight of copper, based on the weight of silver. By this, it is possible to suppress the light absorbance to or below 10%.

Furthermore, the above-mentioned two choices may be adopted in combination. Namely, the alloy containing 0.3 to 1% by weight of palladium and 0.3 to 1% by weight of copper based on the weight of silver, and magnesium may be co-vapor deposited to form an alloy in which the atomic ratio of the silver-palladium-copper alloy to magnesium is in the range of from 4:1 to 14:1. In this case, too, the light absorbance can be suppressed to or below 10%, so that the effect of improving the luminance-current efficiency can be obtained.

Naturally, in the case of using silver alone, also, the light absorbance can be suppressed to or below 10% and the luminance-current efficiency improving effect can be obtained.

Thus, in the organic EL device as described in the present embodiment, the semi-transparent reflective layer 4a is composed of silver or an alloy containing silver as a main constituent, so that the light absorbance in the semi-transparent reflective layer 4a can be suppressed to or below 10%. Therefore, absorption of light in the semi-transparent reflective layer 4a can be restrained to the utmost, and the light emitted from the organic light-emitting layer 3c can be efficiently taken out from the side of the second electrode 4 to the outside.

Moreover, in the organic EL device according to the present embodiment, the regulations such as setting the silver-to-magnesium atomic ratio to within the range of from 4:1 to 14:1 make it possible to obviate the deterioration with time to the utmost and, therefore, to suppress the generation of dark spots or the like, resulting in that the reliability of the organic EL device can be enhanced.

In addition, in the organic EL device according to the present embodiment, the top emission type device has the resonator structure in which the light emitted from the organic light-emitting layer 3c is resonated between the first electrode 2 and the semi-transparent reflective layer 4a of the second electrode 4. Therefore, it is possible to augment only the light corresponding to the resonance wavelength and to take out the light with a high peak and a narrow spectrum, so that it is possible to enlarge the color reproduction range of the light emitted and to enhance the color purity of the light.

It should be noted here that, in the case of the resonator structure, it is desirable to regulate the light reflectance in the semi-transparent reflective layer 4a to be not less than 20%, preferably about 40%, while suppressing the light absorbance in the semi-transparent reflective layer 4a to or below 10% as above-described. This is because the light emitted from the organic light-emitting layer 3c can be securely resonated in the resonance portion of the resonator structure when the light reflectance of the semi-transparent reflective layer 4a is not less than 20%.

Furthermore, in the case of adopting the resonator structure, it is desirable to set the optical film thickness of the resonance portion composed of the organic layer 3 so that $2L/\lambda$ becomes a positive minimum value and the relationship of $2L/\lambda + \Phi/2\pi = q$ (q is an integer) is satisfied, as has been described in the present embodiment. With such a setting, the light in the vicinity of the wavelength $\lambda$ shows multiple interference in the resonance portion. Moreover, the spectrum of the light taken out is maintained with a largest width within the range in which the multiple interference of the light of the wavelength $\lambda$ occurs. Namely, the peak intensity is enhanced by the multiple interference while the spectrum of the light taken out retains a certain width. Therefore, in the organic EL device according to the present embodiment, even when the angle of visibility is staggered, the shift amount of the wavelength λ is suppressed to be small, and enhancement of the color purity in a wide range of angle of visibility is contrived.

While the case of applying the present invention to a top emission type organic EL device has been described as an example in the present embodiment, this is not limitative; namely, the present invention can be applied, for example, to a both-side transparent type organic EL device in the same manner as above. In other words, the present invention is applicable to an organic EL device so constituted that the light from a light-emitting layer is taken out to at least one of the first electrode side and the second electrode side.

As has been described above, the organic EL device according to the present invention makes it possible to suppress to the utmost the absorption of light in the electrode on the side of taking out the light, to efficiently take out the light on the side of the electrode and, therefore, to obtain good luminance efficiency and the like. Besides, attendant on this, suppression of the generation of dark spots and the like can be expected, with the result that reliability of the organic EL device can be enhanced.

The invention claimed is:

1. An organic electroluminescence device comprising a light-emitting layer comprised of an organic material, said light-emitting layer being positioned between a first electrode and a second electrode, and light from said light-emitting layer being transmitted through at least one of said first electrode and said second electrode, wherein the electrode or electrodes through which light is transmitted being comprised of a semi-transparent reflective layer made of silver alloy and a transparent electrode layer laminated in this order from the side of the light emitting layer, and the light absorbance of the electrode or electrodes on the side of taking out light from the light-emitting layer is not more than 10%; and further wherein said alloy containing silver as a main constituent is an alloy containing 0.3 to 1% by weight of palladium and 0.3 to 1% by weight of copper based on the weight of silver, and magnesium, in an atomic ratio of said silver-palladium-copper alloy to magnesium of from 4:1 to 14:1.

* * * * *